(12) United States Patent
Yu et al.

(10) Patent No.: US 8,171,626 B1
(45) Date of Patent: May 8, 2012

(54) METHOD FOR FORMING EMBEDDED CIRCUIT

(75) Inventors: Cheng-Po Yu, Taoyuan County (TW);
Chi-Min Chang, Taoyuan County (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 13/155,375

(22) Filed: Jun. 7, 2011

(30) Foreign Application Priority Data

Dec. 29, 2010 (TW) .............................. 99146584 A

(51) Int. Cl.
*H05K 3/02* (2006.01)
*H05K 3/10* (2006.01)
*H05K 3/00* (2006.01)
*H01R 9/00* (2006.01)
*H01R 43/00* (2006.01)

(52) U.S. Cl. .............................. 29/846; 29/842; 29/825

(58) Field of Classification Search ................. 29/825, 29/829–830, 841–842, 846; 438/106–107, 438/127–129; 174/250–251, 255–256, 258, 174/261–262
See application file for complete search history.

(56) References Cited

U.S. PATENT DOCUMENTS

| | | | |
|---|---|---|---|
| 6,040,230 A * | 3/2000 | Anthony et al. | 438/398 |
| 6,596,548 B2 * | 7/2003 | Hong | 438/3 |
| 6,610,151 B1 * | 8/2003 | Cohen | 118/719 |
| 6,853,520 B2 * | 2/2005 | Fukuzawa et al. | 360/324.1 |
| 6,887,773 B2 * | 5/2005 | Gunn et al. | 438/481 |
| 6,988,312 B2 * | 1/2006 | Nakamura et al. | 29/830 |
| 7,074,685 B2 * | 7/2006 | Magnee et al. | 438/312 |
| 7,341,945 B2 * | 3/2008 | Yamamoto | 438/687 |
| 7,514,313 B2 * | 4/2009 | Zia et al. | 438/218 |
| 7,524,757 B2 * | 4/2009 | Kim et al. | 438/634 |
| 7,893,524 B2 * | 2/2011 | Sunohara et al. | 257/678 |
| 7,977,181 B2 * | 7/2011 | Lai et al. | 438/199 |
| 2002/0146882 A1 * | 10/2002 | Hong | 438/240 |
| 2003/0027427 A1 * | 2/2003 | Ma et al. | 438/700 |
| 2004/0074088 A1 * | 4/2004 | Nakamura et al. | 29/831 |
| 2004/0092104 A1 * | 5/2004 | Gunn et al. | 438/689 |
| 2005/0218399 A1 * | 10/2005 | Magnee et al. | 257/19 |
| 2007/0235813 A1 * | 10/2007 | Zia et al. | 257/369 |
| 2009/0115073 A1 * | 5/2009 | Sunohara et al. | 257/778 |
| 2009/0224330 A1 * | 9/2009 | Hong et al. | 257/368 |
| 2010/0151675 A1 * | 6/2010 | Tada et al. | 438/637 |
| 2011/0073987 A1 * | 3/2011 | Mackh et al. | 257/531 |

FOREIGN PATENT DOCUMENTS

| | | | |
|---|---|---|---|
| TW | 396568 | * | 7/2000 |
| TW | 484203 | * | 4/2002 |
| TW | I310599 | * | 6/2009 |

* cited by examiner

*Primary Examiner* — David Angwin
(74) *Attorney, Agent, or Firm* — Winston Hsu; Scott Margo

(57) ABSTRACT

A method for forming an embedded circuit is disclosed. First, a substrate including a dielectric layer is provided. Second, the dielectric layer is entirely covered by a dummy layer. Then, the dummy layer is patterned and a trench is formed in the dielectric layer at the same time. Later, a seed layer is formed to entirely cover the dummy layer and the trench. Next, the dummy layer is removed and the seed layer covering the dummy layer is removed, too. Afterwards, a metal layer is filled in the trench to form an embedded circuit embedded in the dielectric layer.

16 Claims, 7 Drawing Sheets

METHOD FOR FORMING EMBEDDED CIRCUIT

BACKGROUND OF THE INVENTION

1. Field of the Invention

The present invention relates to a method for forming an embedded circuit. In particular, the present invention relates to a method for forming an embedded circuit by using a dummy layer. The dummy layer is not only resistant to the acidic or alkaline conditions or organic solvents, but also does not interfere with the formation of the seed layer. The method of the present invention is advantageous in mass production and in circuit board structure.

2. Description of the Prior Art

A circuit board is an essential element in an electronic device. The function of the circuit boards is to define the pre-determined circuit patterns on a solid surface. Along with the trend of miniaturization of the electronic devices, the line width and the line space of the conductive wires on the circuit boards are becoming narrower and narrower. The embedded circuit structure draws more and more attention than ever in order to pursue a thinner product, to meet the demands of finer wires and to overcome the drawbacks of the etching procedure and reliability. Because in the embedded circuit structure the wire pattern is embedded in the substrate, the thickness of the wires seems to be omitted, thereby further reducing the thickness of the products after packaging.

With the development of shrinking dimensions of the electronic devices, the circuit board is usually disposed in a limited space. Currently, there are several methods available to form the circuit boards to meet the demand. The first one is to transfer-print patterned wires into a dielectric layer. Another one is to pattern the substrate by means of a laser fashion to define an intaglio structure. Then a conductive material is used to fill the recess formed on the substrate to obtain an embedded circuit structure.

For the current solution, it is produced by direct circuit design. For example, a laser is used to pattern a substrate. Then a conductive material is used to fill the recess formed on the substrate to obtain an embedded circuit structure. FIGS. 1-5 illustrates a conventional method to form an embedded circuit. Please refer to FIG. 1, first a substrate 101 is provided. The substrate 101 includes a dielectric layer 110, an inner layer 111 and an interconnecting circuit 112. The interconnecting circuit 112 is disposed on the inner layer 111 and the dielectric layer 110 covers the interconnecting circuit 112 and the inner layer 111 at the same time. In addition, the dielectric layer 110 also includes a via column 113 which is electrically connected to the interconnecting circuit 112.

Second, as shown in FIG. 2, a mask layer 114 is used to completely cover the dielectric layer 110 and the via column 113. The mask layer 114 is required to have many features to facilitate the following steps. The features of the mask layer 114 will be described in the following paragraphs.

First, as shown in FIG. 3, a laser is used to pattern the mask layer 114. The laser may be used to define the pattern and the location of the needed circuits. For example, trenches 115 of different width are formed after the laser patterns the mask layer 114. Some of the trenches 115 may expose the via column 113.

Then, as shown in FIG. 4, a desmear step is carried out. Because there may be some remaining residues 116 after the laser patterns the mask layer 114 and the remaining residues 116 degrade the quality of the following electrical connection, a pre-treatment step is carried out to remove the remaining possible residues 116 after the laser patterns the mask layer 114 to facilitate the later formation of the electrical connection. There may be an organic solvent or an oxidizing agent used in the pre-treatment step so the mask layer 114 must be resist to the corrosion of the organic solvent or the oxidizing agent. In addition, a base or an acid may also be used in the pre-treatment step, so the mask layer 114 must also be resistant to the corrosion of the acid or the base.

Next, as shown in FIG. 5, a seed layer 117 is formed. The resultant seed layer 117 may induce and facilitate the formation of the later formed copper circuit (not shown) in the trench 115. Because the copper circuit (not shown) is required solely and exclusively to form in the trench 115, the seed layer 117 accordingly has to be selectively and specifically formed in the trench 115 without covering the mask layer 114. By the difference between the mask layer 114 and the dielectric layer 110, the seed layer 117 is required to solely and exclusively form on the exposed dielectric layer 110 rather than on the mask layer 114.

In the light of the above, the mask layer 114 not only must be resistant to the corrosion of the organic solvent or the oxidizing agent, but also be resistant to the corrosion of the acid or the base and impossible for the formation of the seed layer 117 so the seed layer 117 is selectively and specifically formed in the trench 115. The development of the materials for the mask layer 114 becomes very difficult due to the various requirements of the mask layer 114.

Further, in order to avoid the mask layer 114 falling off due to the attack of the chemical agents in the desmear step, weaker chemical agents are used. However, when the chemical agents are weaker, it is more likely to have remaining residues and the reliability of the products is more likely to be compromised. Circuits of bad quality are not welcome.

Given the above, a novel method for forming an embedded circuit is still needed to provide a reliable circuit board product.

SUMMARY OF THE INVENTION

The present invention therefore proposes a method for forming an embedded circuit, to provide a circuit board of good and reliable quality. In the method of the present invention, a dummy layer is used to form the embedded fine circuit. Such dummy layer is not only resistant to the acidic or alkaline conditions or organic solvents, but also does not interfere with the formation of the seed layer. The method of the present invention is advantageous in mass production and in circuit board structure.

The present invention therefore in a first aspect proposes a method for forming an embedded circuit. First, a substrate is provided. The substrate includes a dielectric layer. Second, the dielectric layer is entirely covered with a dummy layer. Next, the dummy layer is patterned and simultaneously a trench is formed in the dielectric layer. Then, a seed layer is formed to entirely cover the dummy layer and the trench. Later, the dummy layer and the seed layer covering the dummy layer are removed but part of the seed layer remains in the trench. Afterwards, the trench is filled with a metal layer to form an embedded circuit which is embedded in the dielectric layer.

In one embodiment of the present invention, the substrate includes an inner layer, an inner circuit and the dielectric layer. The inner circuit is disposed on the inner layer and the dielectric layer simultaneously covers the inner layer and the inner circuit.

In another embodiment of the present invention, the dummy layer is not a photoresist so the dummy layer includes no photo-sensitive material.

In another embodiment of the present invention, at least one of a physical manner and a chemical manner may be used to remove the dummy layer.

In another embodiment of the present invention, the seed layer disposed in the trench substantially remains intact when the dummy layer is removed.

In another embodiment of the present invention, the embedded circuit has a line width less than 30 µm.

In another embodiment of the present invention, the embedded circuit has a line pitch less than 30 µm.

These and other objectives of the present invention will no doubt become obvious to those of ordinary skill in the art after reading the following detailed description of the preferred embodiment that is illustrated in the various figures and drawings.

DETAILED DESCRIPTION

The present invention therefore provides a method for forming an embedded circuit, to provide a circuit board of good and reliable quality. In the method of the present invention, a dummy layer is used to form the embedded fine circuit. Such dummy layer is not only photo-sensitive material free, it is also resistant to the acidic or alkaline conditions or organic solvents and does not interfere with the formation of the seed layer. The method of the present invention is advantageous in mass production and in circuit board structure.

Figure 1:
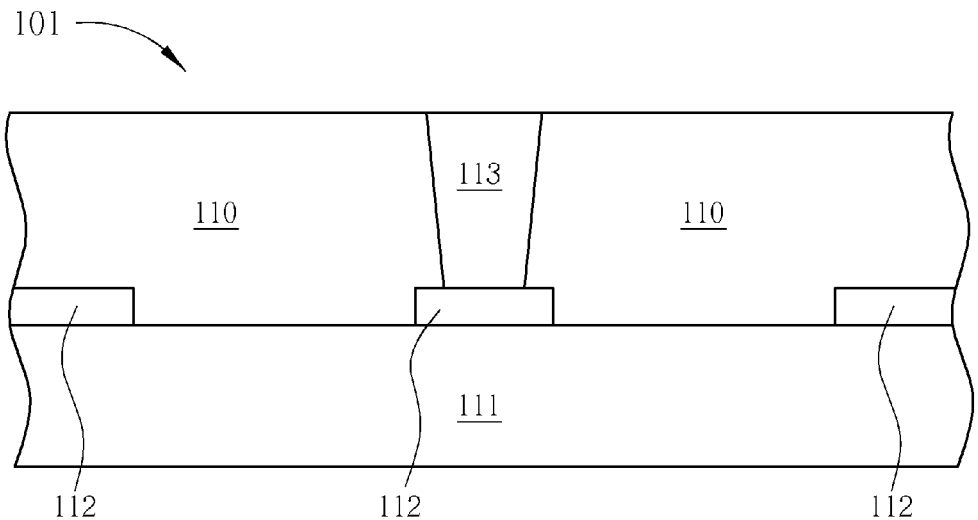
FIG. 1-5 illustrates a conventional method to form an embedded circuit.
Figure 2:
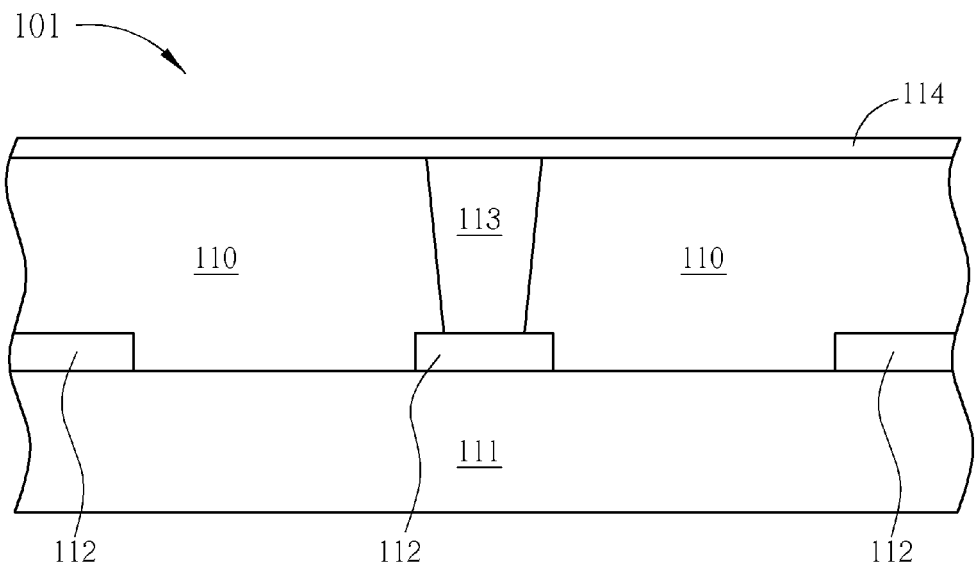
Figure 3:
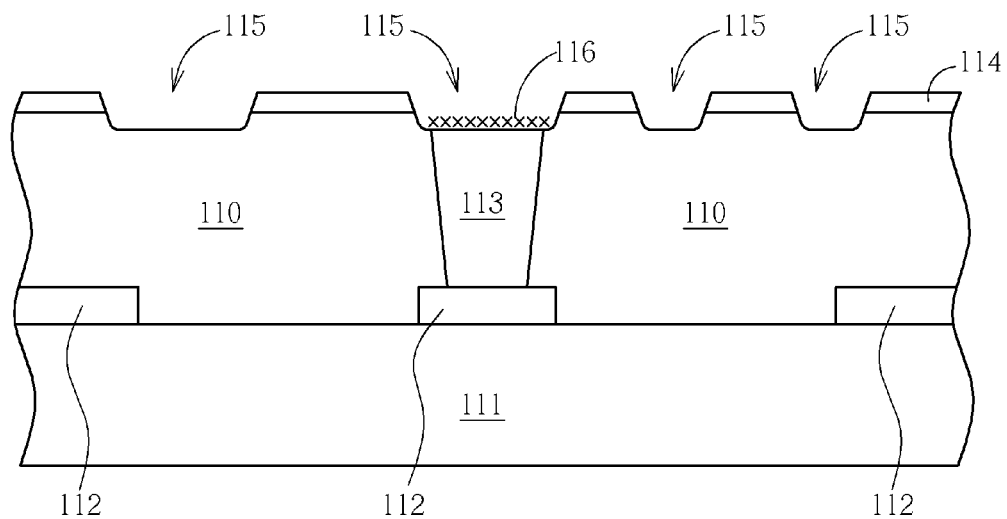
Figure 4:
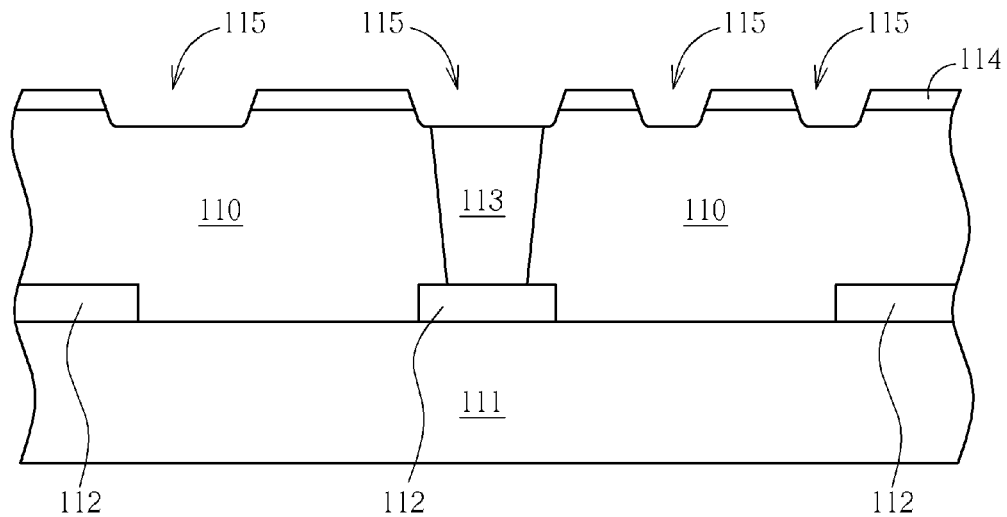
Figure 5:
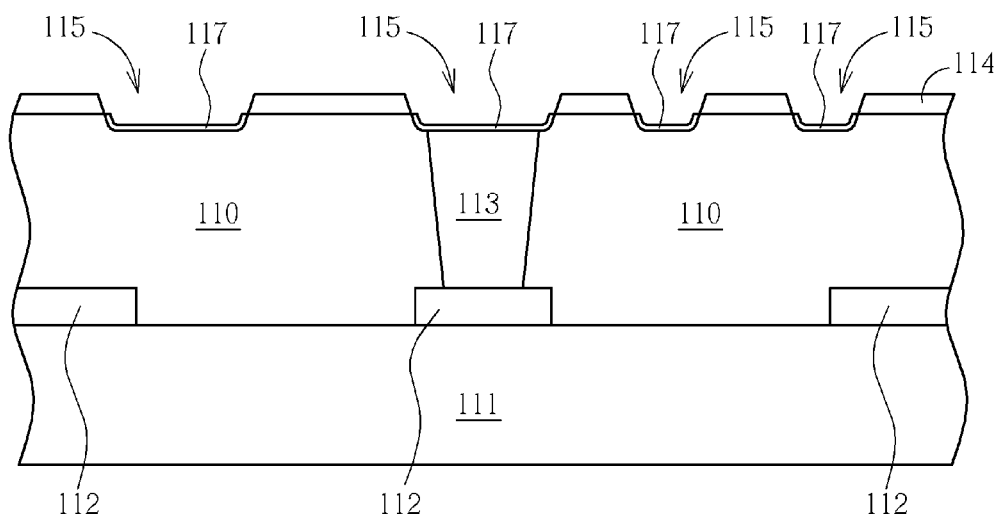
Figure 6:
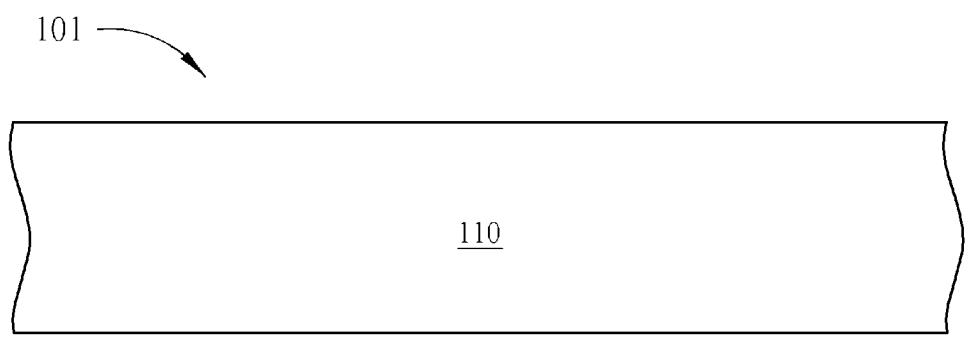
FIGS. 6-13 illustrate a method for forming an embedded circuit of the present invention.

FIGS. 6-12 illustrate a method for forming an embedded circuit of the present invention. As shown in FIG. 6, first a substrate 101 is provided. The substrate 101 includes at least a dielectric layer 110. Please refer to FIG. 1, in another embodiment of the present invention, the substrate 101 may include a dielectric layer 110, an inner layer 111, and an interconnecting circuit 112. The dielectric layer 110 and the inner layer 111 may respectively be an insulating material. The interconnecting circuit 112 is disposed on the inner layer 111 and usually includes a metal, such as copper (Cu). The dielectric layer 110 simultaneously covers the inner layer 111 and the interconnecting circuit 112. In addition, optionally the dielectric layer 110 may further include a via column 113 which is formed by forming a via hole penetrating the dielectric layer 110 and exposing the interconnecting circuit 112 then filled with a metal which is electrically connected to the interconnecting circuit 112, as shown in FIG. 1. The via column 113 includes the via hole and the metal.

Figure 7:
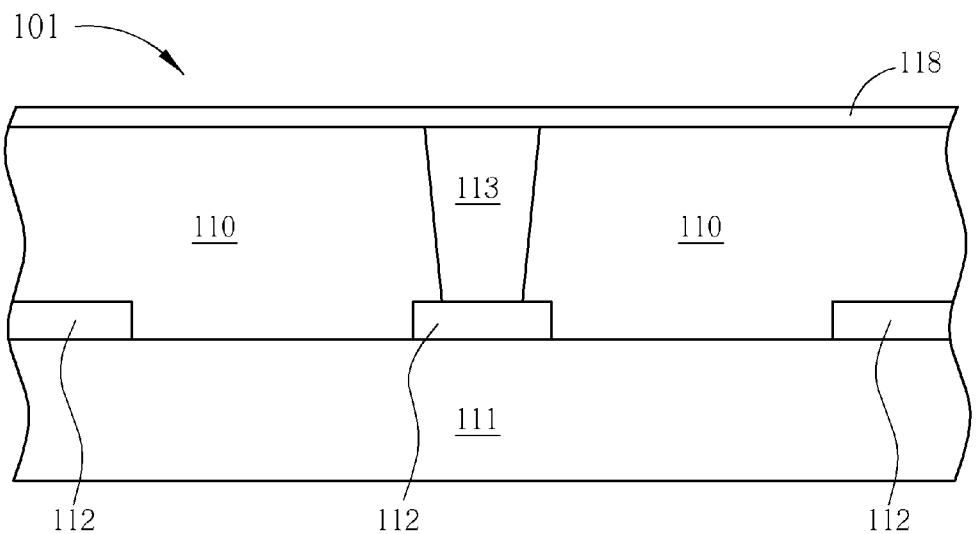

Second, as shown in FIG. 7, a dummy layer 118 is used to completely cover the dielectric layer 110 and the via column 113. The dummy layer 118 generally includes a thermopolymeric material and may be a polymer material of oligomers. The dummy layer 118 may have various monomers before curing and the oligomerization may be enhanced by a baking step. The dummy layer 118 may have various polymeric groups, such as an epoxy group with (artificially) modified rubber, an acrylic group, an imide group or an amide group . . . etc., after the polymerization reaction. In addition, there may be some optional additives, such as a defoamer, or a wetting agent. Accordingly, the dummy layer 118 is a co-polymer of low polymerization degree after the polymerization reaction. For example, the dummy layer 118 may undergo a baking step of 70° C.-120° C. for around 30 minutes for curing, so that the dummy layer 118 may have a resultant thickness of around 0.5 µm-30 µm. Please note that the curing step of the dummy layer 118 does not involve a photo-initiative reaction.

Figure 8:
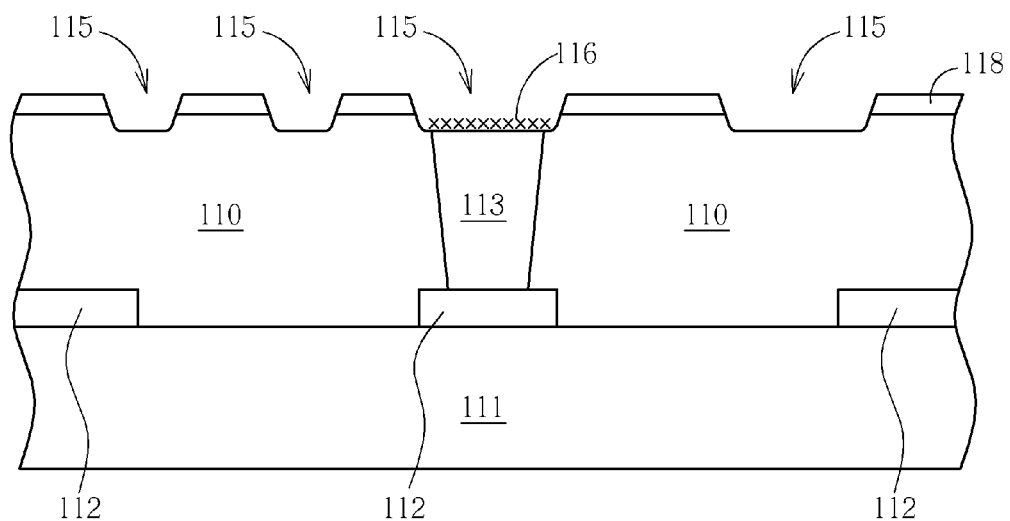

Next, as shown in FIG. 8, the dummy layer 118 may be patterned by a laser. The laser may also remove some of the dielectric layer 110 to simultaneously form a trench 115 in the dielectric layer 110. An UV laser or an excimer may be used to define the locations or the patterns of the needed circuit. For example, various trenches 115 of different widths are formed after the dummy layer 118 is patterned by a laser. The trenches 115 may have suitable widths or pitches. For example, the trenches 115 per se may have a line width less than 30 µm. Besides, the trenches 115 per se may also have a pitch less than 30 µm. Some of the trenches 115 may even expose the via columns 113. The dummy layer 118 is not patterned by an optical image transfer process so the dummy layer 118 is actually not a photoresist.

Figure 9:
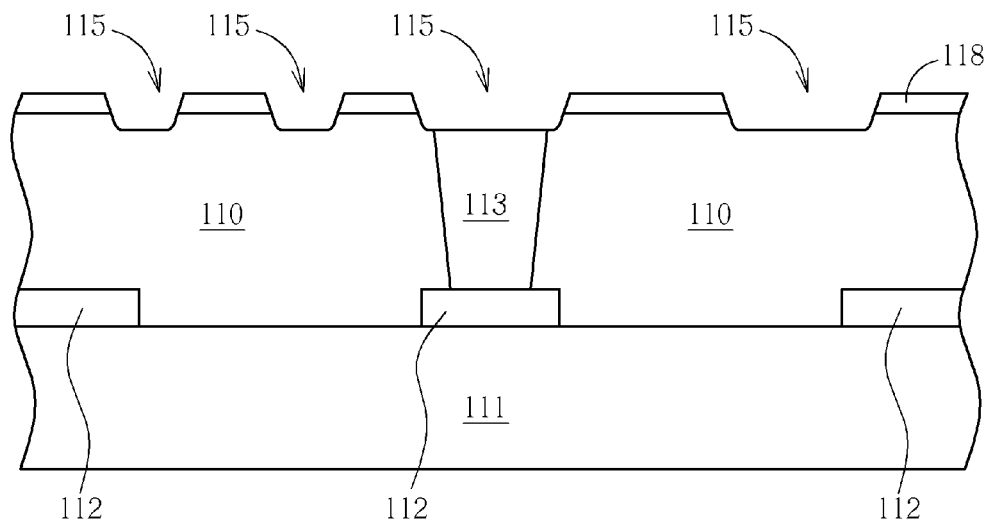

Then, as shown in FIG. 9, a desmear step may be carried out. Because there may be some residues 116 which remain on the inner wall of the trenches 115 and degrade the quality of the electrical connection in the following step, a desmear step is carried out to remove the possible residues 116 which remain on the inner wall of the trenches 115 after the dummy layer 118 is patterned by the laser to facilitate the later formation of the electrical connection. The desmear step may involve a plasma treatment, an organic solvent treatment such as alcohols, ethers, DMSO, DMF . . . etc. to render the patterned dummy layer 118 swelled, or an oxidizing agent, such as aqueous sulfuric acid/hydrogen peroxide, and MnO4⁻ . . . etc. so the patterned dummy layer 118 is resistant to the corrosion of an organic solvent or an oxidizing agent. Besides, the desmear step may also involve an acid, such as sulfuric acid, or a weak base, so the patterned dummy layer 118 is resistant to the corrosion of an acid or a weak base as well.

Figure 10:
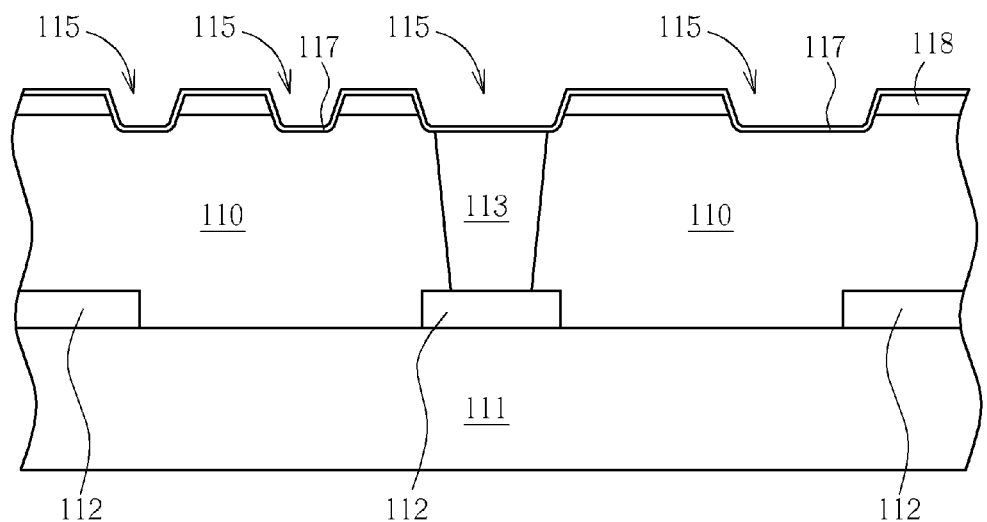

Next, as shown in FIG. 10, a seed layer 117 is formed. The resultant seed layer 117 may induce and facilitate the formation of the later formed copper circuit (not shown) in the trench 115. Because of the special properties of the dummy layer 118 of the present invention, the seed layer 117 is allowed to form in the trench 115, or the seed layer 117 may also cover the surface of part of the dielectric layer 110 which is exposed by the trench 115 and covers the dummy layer 118. For example, the surface of part of the dielectric layer 110 exposed by the trench 115 is soaked in a solution containing at least a noble metal such as Pt, Pd, Au or Rh, so that the resultant seed layer 117 is able to completely cover the trench 115 and the surface of part of the dielectric layer 110 exposed by the trench 115. Of course, the resultant seed layer 117 may also selectively cover the trench 115 and the surface of part of the dielectric layer 110 exposed by the trench 115.

Figure 11:
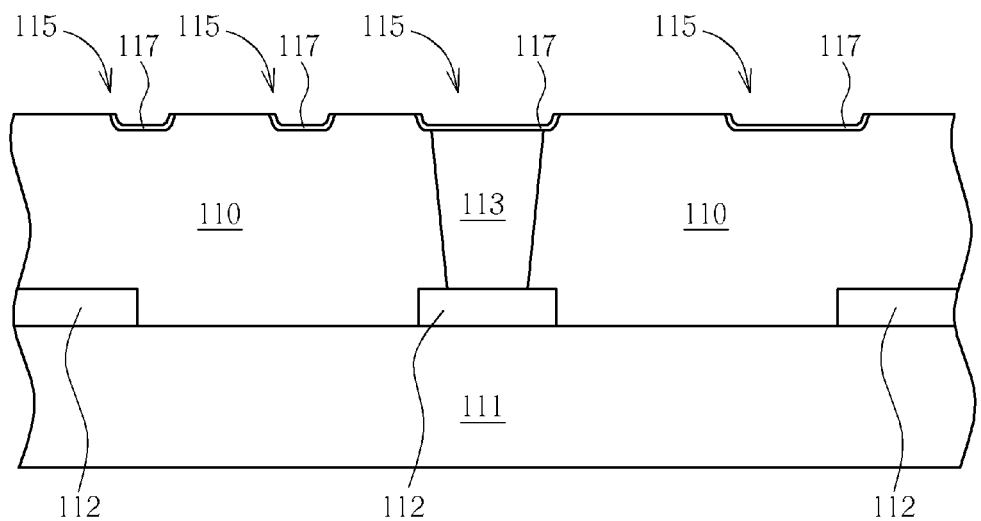

Later, as shown in FIG. 11, the dummy layer 118 is completely removed. Because there is some of the seed layer 117 covering the dummy layer 118, such seed layer 117 which covers the dummy layer is also removed when the dummy layer 118 is completely removed. For example, the dummy layer 118 may be removed chemically or physically.

The dummy layer 118 may be removed by an alkaline solution chemically. The alkaline solution may contain a strong inorganic base, such as sodium hydroxide. The alkaline solution may have a pH value greater than 11, preferably between pH 11-pH 13. The physical way may play a dominant part or an auxiliary part to remove the dummy layer 118. For example, the physical way may be brushing, polishing, plasma treating or ultra-sonic treating. In a better embodiment, the dummy layer 118 is completely removed without damaging the quality of the seed layer 117 in the trench 115.

Figure 12:
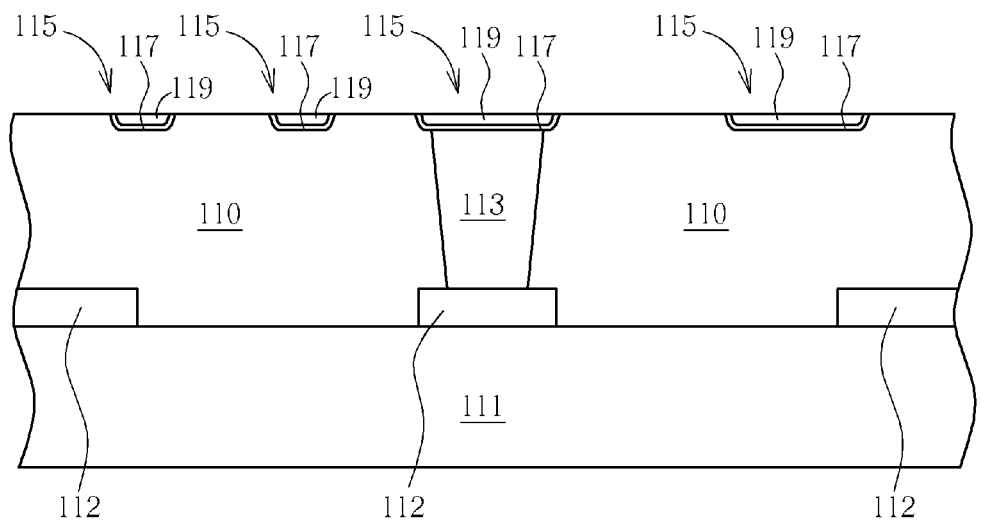
Figure 13:
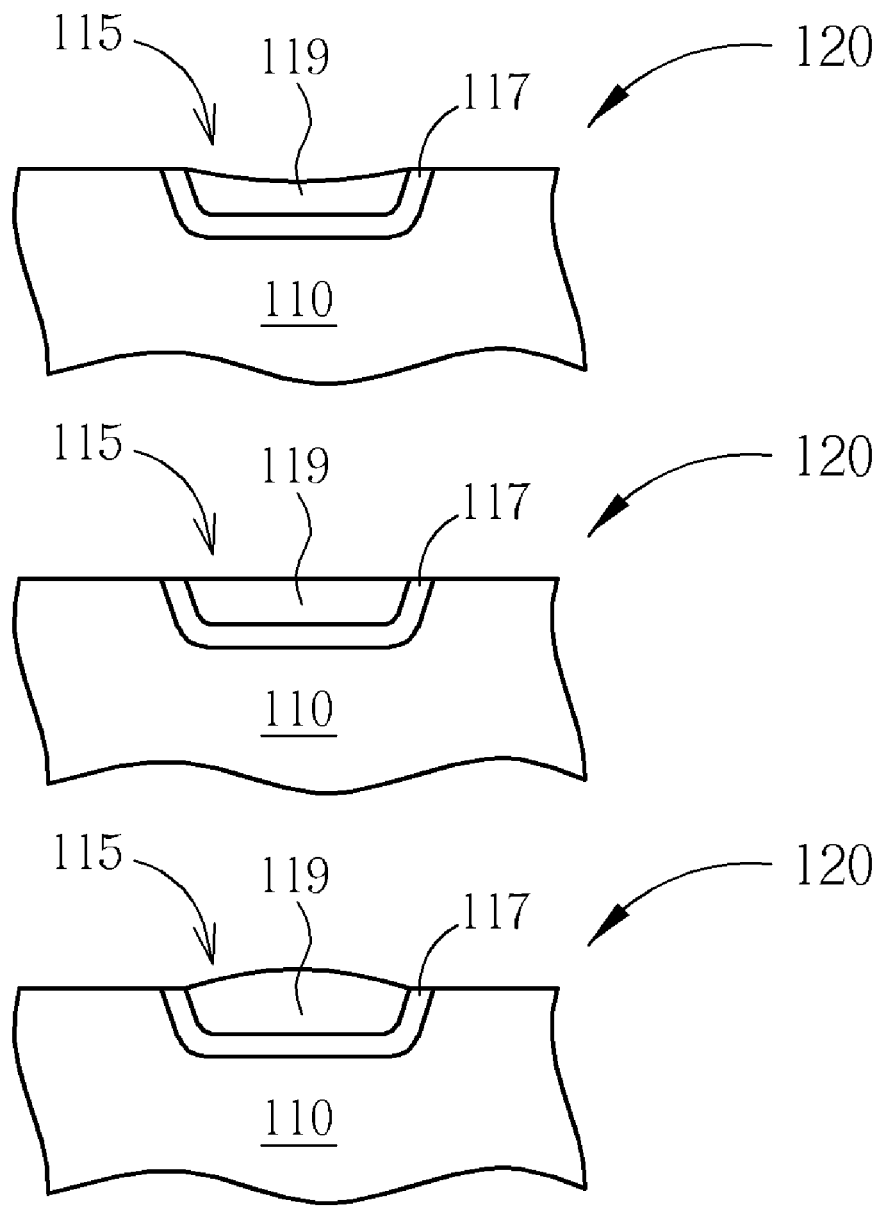

Afterwards, as shown in FIG. 12, a metal layer 119 layer of a sufficient thickness is formed in the trench 115 by electroless-plating so that the metal layer 119 becomes an embedded circuit 120 embedded in the dielectric layer 110. Please refer to FIG. 13, the metal layer 119 which is embedded in the dielectric layer 110 may have various embodiments. For example, the top of the metal layer 119 is slightly lower than the top of the dielectric layer 110, or the top of the metal layer 119 is roughly as high as the top of the dielectric layer 110, or the top of the metal layer 119 is slightly higher than the top of the dielectric layer 110.

The metal layer 119 is usually a layer of copper made by a way of chemical deposition reaction rather than by a way of electroplated deposition reaction. Optionally, a pre-electroless plating step may be carried out to form a pre-layer of a thickness about 2 μm, to facilitate the formation of the embedded circuit 120 to form a layer of chemical deposited copper of a thickness around 5-30 μm. After the previous step, an embedded circuit 120 embedded in the dielectric layer 110 is obtained. The embedded circuit 120 includes a layer of metal 119 chemically made of chemical deposited copper which is disposed in the trench 115 and on the seed layer 117.

Preferably, the desmear step may also render the exposed part of the trench 115, i.e. the surface of the dielectric layer 110, to have a suitable roughness. For example, the roughness Ra may be 0.5 μm-5.0 μm. Please refer to JIS B 0601 of the latest edition for the definitions and the details of the roughness Ra. Or, the desmear step may render the final chemically made metal layer 119 to have a peel stress greater than 0.5 kg/cm.

The present invention produces an embedded circuit by a dummy layer. Such dummy layer is not only resistant to the acidic or alkaline conditions or organic solvents, but also does not interfere with the formation of the seed layer. The method of the present invention is advantageous in mass production and in circuit board structure.

Those skilled in the art will readily observe that numerous modifications and alterations of the device and method may be made while retaining the teachings of the invention.

What is claimed is:

1. A method for forming an embedded circuit, comprising:
    providing a substrate comprising a dielectric layer;
    entirely covering said dielectric layer with a dummy layer;
    patterning said dummy layer and simultaneously forming a trench in said dielectric layer;
    forming a seed layer to entirely cover said dummy layer and said trench;
    removing said dummy layer and simultaneously removing said seed layer covering said dummy layer; and
    filling said trench with a metal layer to form an embedded circuit embedded in said dielectric layer.

2. The method for forming an embedded circuit of claim 1, wherein said substrate comprises an inner layer, an inner circuit disposed on said inner layer and said dielectric layer covering said inner circuit and said inner layer.

3. The method for forming an embedded circuit of claim 2, further comprising:
    forming a via hole penetrating said dielectric layer and exposing said inner circuit; and
    filling said via hole with said metal layer.

4. The method for forming an embedded circuit of claim 3, wherein said inner circuit is electrically connected to said metal layer in said via hole.

5. The method for forming an embedded circuit of claim 1, wherein said dummy layer comprises a thermo-polymeric material.

6. The method for forming an embedded circuit of claim 5, wherein said dummy layer has thickness of 0.5 μm-30 μm.

7. The method for forming an embedded circuit of claim 1, wherein at least a UV laser and an excimer is used to pattern said dummy layer and to simultaneously form said trench in said dielectric layer.

8. The method for forming an embedded circuit of claim 1, wherein said seed layer comprises at least one of Pt, Pd, Au and Rh.

9. The method for forming an embedded circuit of claim 1, wherein said dummy layer is chemically removed.

10. The method for forming an embedded circuit of claim 9, wherein said dummy layer is chemically removed by an alkaline solution.

11. The method for forming an embedded circuit of claim 10, wherein said alkaline solution comprises an inorganic base.

12. The method for forming an embedded circuit of claim 1, wherein said dummy layer is auxiliarily removed physically.

13. A method for forming an embedded circuit, comprising:
    providing a substrate comprising a dielectric layer;
    entirely covering said dielectric layer with a dummy layer;
    patterning said dummy layer and simultaneously forming a trench in said dielectric layer;
    forming a seed layer to selectively cover said trench and the surface of said dielectric layer exposed by said trench;
    removing said dummy layer; and
    filling said trench with a metal layer to form an embedded circuit embedded in said dielectric layer.

14. The method for forming an embedded circuit of claim 13, further comprising:
    forming a via hole penetrating said dielectric layer and exposing said inner circuit; and
    filling said via hole with said metal layer.

15. The method for forming an embedded circuit of claim 14, wherein said inner circuit is electrically connected to said metal layer in said via hole.

16. The method for forming an embedded circuit of claim 13, wherein said dummy layer is removed by at least one of a chemical way, a physical way and the combination thereof.

* * * * *